United States Patent
McKnight-MacNeil

(10) Patent No.: US 11,476,188 B2
(45) Date of Patent: Oct. 18, 2022

(54) FABRICATION OF EMBEDDED DIE PACKAGING COMPRISING LASER DRILLED VIAS

(71) Applicant: GaN Systems Inc., Ottawa (CA)

(72) Inventor: Cameron McKnight-MacNeil, Nepean (CA)

(73) Assignee: GaN Systems Inc., Kanata (CA)

( * ) Notice: Subject to any disclaimer, the term of this patent is extended or adjusted under 35 U.S.C. 154(b) by 121 days.

(21) Appl. No.: 17/065,886

(22) Filed: Oct. 8, 2020

(65) Prior Publication Data
US 2022/0115319 A1 Apr. 14, 2022

(51) Int. Cl.
*H01L 23/522* (2006.01)
*H01L 21/768* (2006.01)
*H01L 21/56* (2006.01)
*H01L 23/31* (2006.01)

(52) U.S. Cl.
CPC .......... *H01L 23/5226* (2013.01); *H01L 21/56* (2013.01); *H01L 21/76802* (2013.01); *H01L 23/3107* (2013.01)

(58) Field of Classification Search
CPC .................................................. H01L 23/5226
USPC ......................................................... 257/774
See application file for complete search history.

(56) References Cited

U.S. PATENT DOCUMENTS

| 2016/0174364 | A1* | 6/2016 | Harkness, Jr. | H05K 3/382 174/262 |
| 2020/0389969 | A1* | 12/2020 | Ikeda | H05K 1/025 |
| 2021/0305209 | A1* | 9/2021 | Chen | H01L 25/0657 |

FOREIGN PATENT DOCUMENTS

CN 107211525 B * 11/2020 .......... H05K 1/0237

* cited by examiner

*Primary Examiner* — Ajay Arora
(74) *Attorney, Agent, or Firm* — Miltons IP/p.i.

(57) ABSTRACT

Embedded die packaging for semiconductor devices and methods of fabrication wherein conductive vias are provided to interconnect contact areas on the die and package interconnect areas. Before embedding, a protective masking layer is provided selectively on regions of the electrical contact areas where vias are to be formed by laser drilling. The material of the protective masking layer is selected to control absorption properties of surface of the pad metal to reduce absorption of laser energy during laser drilling of micro-vias, thereby mitigating overheating and potential damage to the semiconductor device. The masking layer is resistant to surface treatment of other regions of the electrical contact areas, e.g. to increase surface roughness to promote adhesion of package dielectric.

18 Claims, 9 Drawing Sheets

Example layup of
embedded die package
with conductive microvias

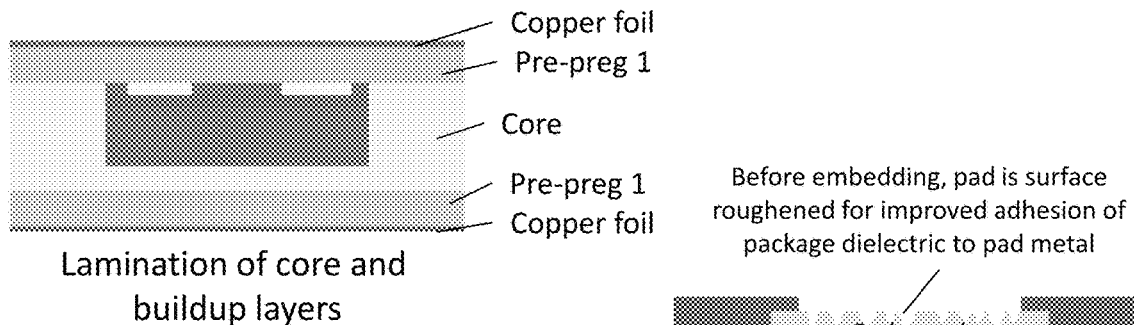

Lamination of core and buildup layers

Fig. 2A (Prior Art)

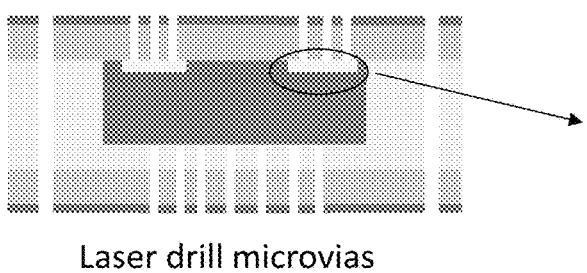

Laser drill microvias

Fig. 2B (Prior Art)

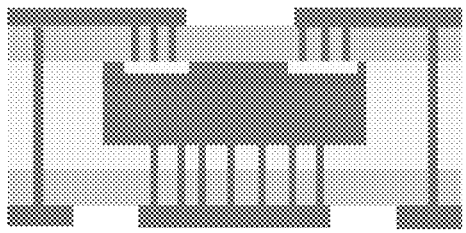

Metal plating, e.g. Cu to form conductive microvias and interconnect layers

Fig. 2C (Prior Art)

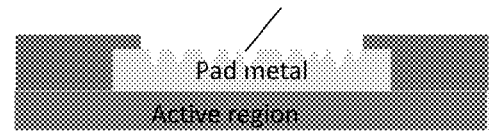

Before embedding, pad is surface roughened for improved adhesion of package dielectric to pad metal

Rough surface of pad metal increases absorption of laser energy during laser drilling
Potential overheating and damage to underlying active region

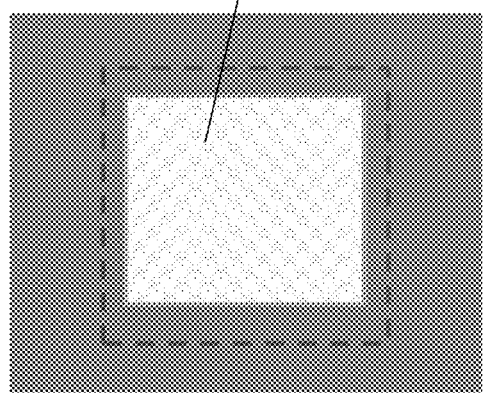

Top plan view of pad area

Fig. 3C (Prior Art)

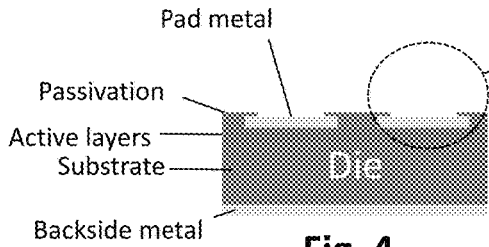

Pad metal
Passivation
Active layers
Substrate
Backside metal

Fig. 4

Fig. 6

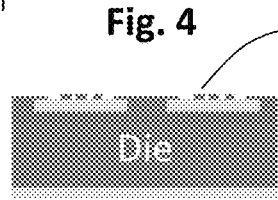

Fig. 5

Masking layer patterned to protect area(s) to be laser drilled

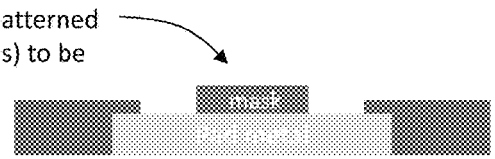

Fig. 7

Fig. 8

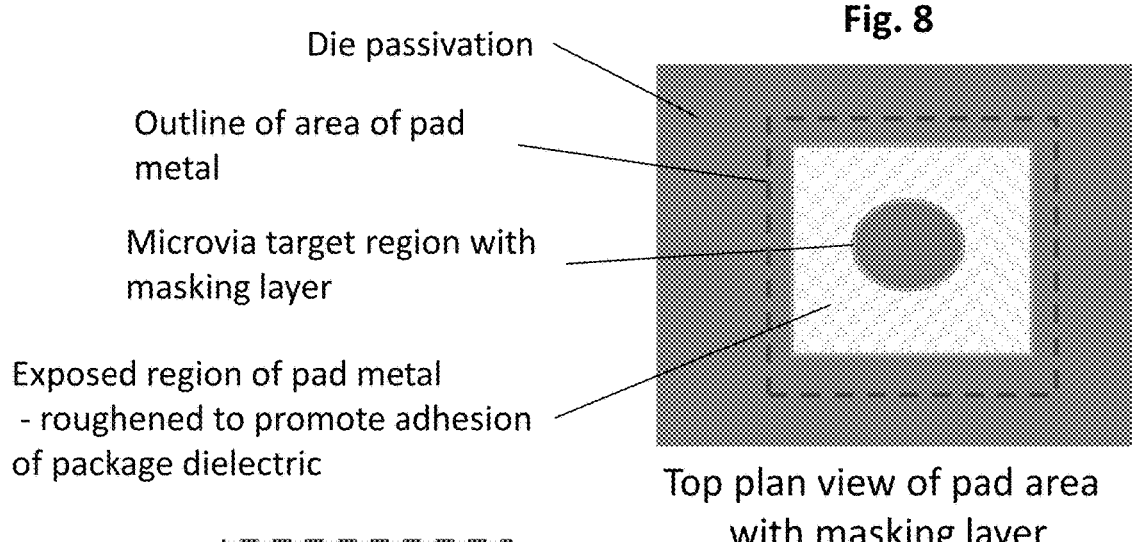

Die passivation

Outline of area of pad metal

Microvia target region with masking layer

Exposed region of pad metal - roughened to promote adhesion of package dielectric Top plan view of pad area with masking layer
Fig. 9

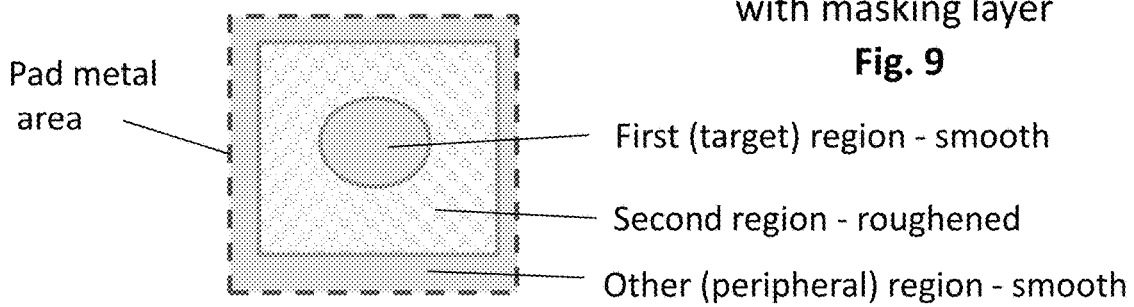

Pad metal area

First (target) region - smooth

Second region - roughened

Other (peripheral) region - smooth

Top plan view - surface plane of pad metal
Fig. 10

Surface regions comprising microvia target areas treated (e.g. masked) for low optical absorption (higher reflectivity) of laser energy during laser drilling Surface regions treated (e.g. roughened) to promote adhesion of package dielectric

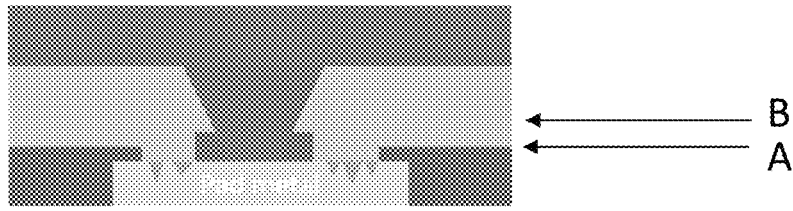

Fig. 20

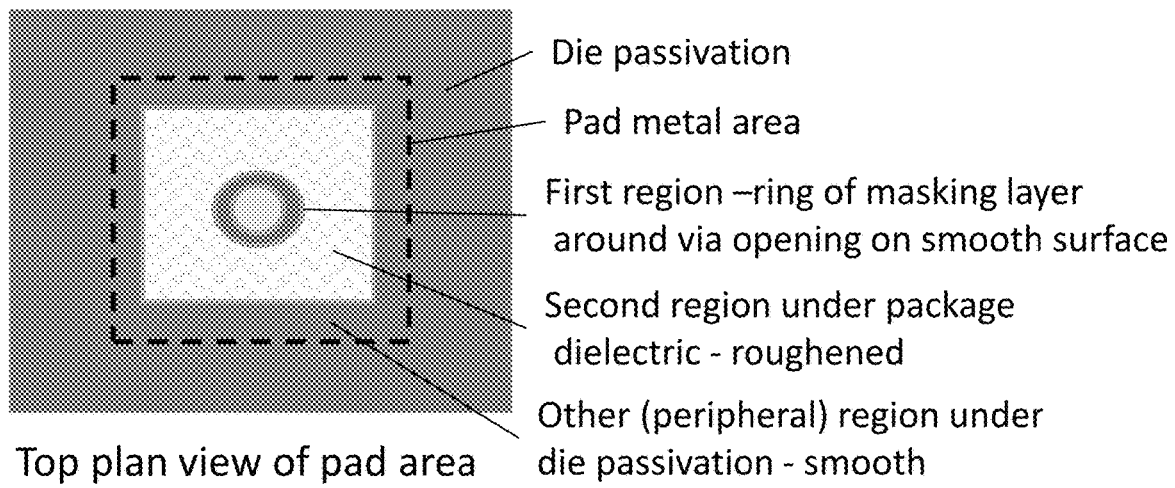

Top plan view of pad area
Plane A

- Die passivation
- Pad metal area
- First region –ring of masking layer around via opening on smooth surface
- Second region under package dielectric - roughened
- Other (peripheral) region under die passivation - smooth

Fig. 21

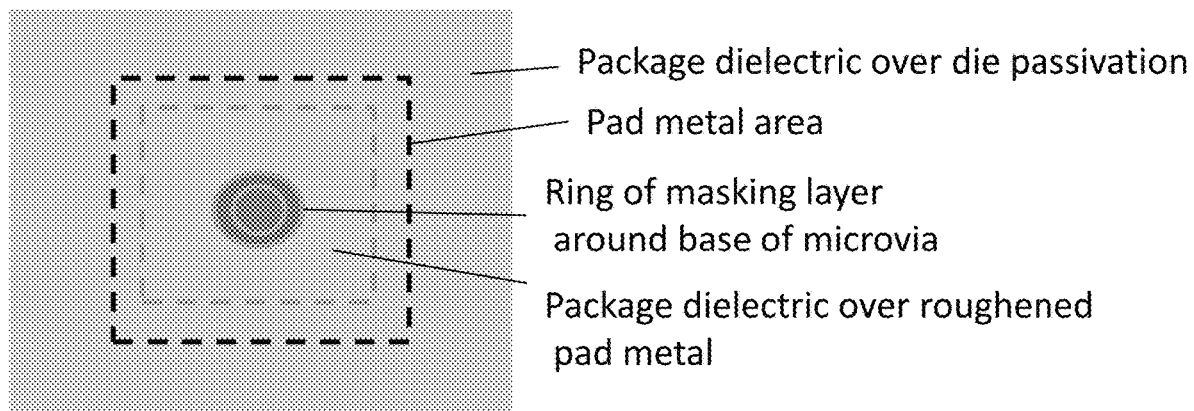

Top plan view of pad area
Plane B

- Package dielectric over die passivation
- Pad metal area
- Ring of masking layer around base of microvia
- Package dielectric over roughened pad metal

Fig. 22

Fig. 23
Fig. 24
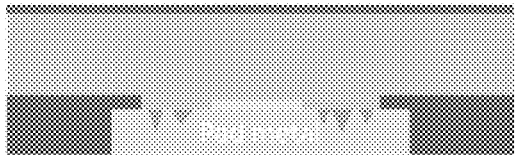
Disc of "non-sacrificial" masking material
Fig. 25
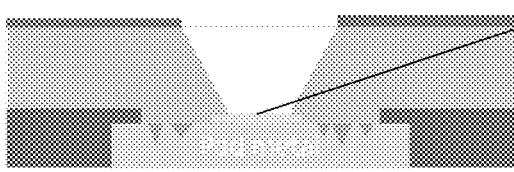
Fig. 26
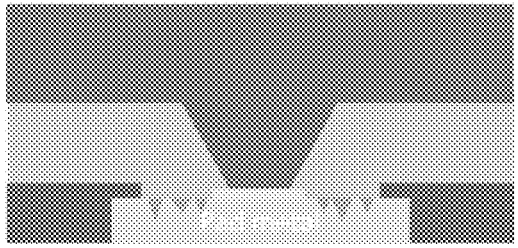
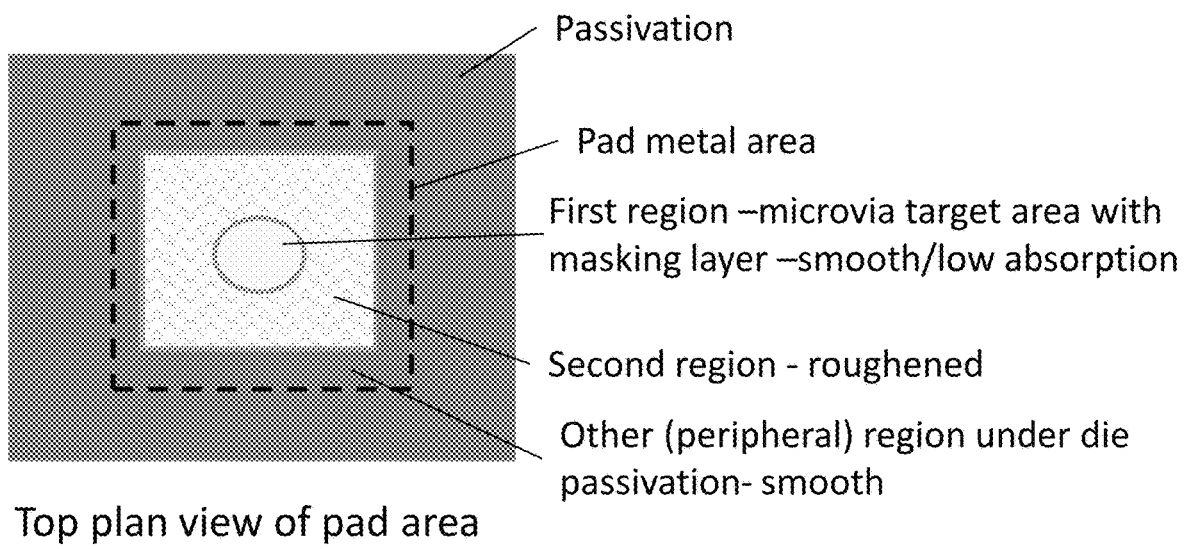
Passivation
Pad metal area
First region – microvia target area with masking layer – smooth/low absorption
Second region - roughened
Other (peripheral) region under die passivation- smooth
Top plan view of pad area
Fig. 27

FABRICATION OF EMBEDDED DIE PACKAGING COMPRISING LASER DRILLED VIAS

CROSS-REFERENCE TO RELATED APPLICATION(S)

This application is related to U.S. patent application Ser. No. 16/928,305, filed Jul. 14, 2020, entitled "Embedded Die Packaging for Power Semiconductor Devices", which is incorporated herein by reference in its entirety.

TECHNICAL FIELD

This invention relates to embedded die packaging for semiconductor devices, and methods of fabrication comprising laser drilling of vias.

BACKGROUND

Packaging solutions that offer low inductance interconnections, and either top-side or bottom-side thermal pads, are disclosed, for example, in the Applicant's earlier filed patent documents: U.S. patent application Ser. No. 15/027,012, filed Apr. 15, 2015, now U.S. Pat. No. 9,659,854, entitled "Embedded Packaging for Devices and Systems Comprising Lateral GaN Power Transistors"; U.S. patent application Ser. No. 15/064,750, filed Mar. 9, 2016, now U.S. Pat. No. 9,589,868, entitled "Packaging Solutions for Devices and Systems Comprising Lateral GaN Power Transistors"; U.S. patent application Ser. No. 15/064,955, filed Mar. 9, 2016, now U.S. Pat. No. 9,589,869, entitled "Packaging Solutions for Devices and Systems Comprising Lateral GaN Power Transistors"; and U.S. patent application Ser. No. 15/197,861, filed Jun. 30, 2016, now U.S. Pat. No. 9,824,949, entitled "Packaging Solutions for Devices and Systems Comprising Lateral GaN Power Transistors". Other examples of embedded die packaging for semiconductor devices are described in the above referenced U.S. patent application Ser. No. 16/928,305, filed Jul. 14, 2020, entitled "Embedded Die Packaging for Power Semiconductor Devices".

The above-referenced patents and patent applications disclose examples of "embedded die packaging" in which a semiconductor die, e.g. a GaN die comprising a transistor or diode, is embedded in a dielectric package body, e.g.: a dielectric polymer resin composition, such as a plastic encapsulation material or a glass fiber epoxy composite, such as FR4 type materials, or a ceramic composite material. Conductive interconnects through the dielectric layers are provided e.g., by copper traces, posts and vias, that provide low inductance interconnections to external contact pads (lands) for source, drain and gate connections. In some types of encapsulated packaging, the GaN die is embedded by overmolding or injection of a polymer dielectric material around the die and conductive interconnect materials. Alternatively, the dielectric body of laminated packaging for embedded GaN dies may be built up from layers of dielectric materials, e.g. as described in Application Note GN002 entitled "Thermal Design for GaN Systems' Top-side cooled GaNPx®-T packaged devices" (30 Oct. 2018 GaN Systems Inc.). This type of laminated packaging provides low parasitic inductance in a compact (i.e. small form factor) package for high voltage, high current GaN e-HEMTs.

The dielectric polymer resin composition forming laminated packaging may include laminate sheets and layers of composite material referred to as prepreg, which is a substrate material, such as woven or non-woven glass-fiber cloth, that is pre-impregnated with one or more polymer materials, such as a dielectric epoxy composition. The dielectric epoxy composition may comprise an epoxy resin, curing agents, additives, such as fire retardants, and fillers and other substances to modify properties of the resulting composite material. One or more pre-cured epoxy laminate sheets and/or uncured prepreg layers are cut to form a cavity for the semiconductor die, and sandwiched between other uncured prepreg layers, i.e. assembled as a layer stack (i.e. layup), and the layers are then bonded together in a press, e.g. in a curing process using heat and pressure, to form a laminated dielectric body of the package in which the semiconductor die is embedded.

A typical embedded die package comprises electrical interconnect layers and conductive vias, e.g. formed from plated copper, and may include a thermal pad, also formed from plated copper. Conductive vias for interconnection of the electrical interconnect layers may be formed by mechanical drilling and/or laser drilling of vias that are then filled with electrically conductive material.

For electrical connections to contact areas (contact pads) of the die, microvias of small dimensions, e.g. diameters in a range of ~100 µm to 150 µm, may be formed by laser drilling through the conductive interconnect layers and dielectric buildup layers of the package body to expose the underlying metal of the contact pads. The microvias are then filled with conductive metallization, e.g. plated copper. For large area contact pads, an array of multiple conductive microvias may be provided on each pad. Thermally conductive microvias may be provided as thermal contacts to a thermal pad of the die.

Typically, metal surfaces of the external contact areas, i.e. external electrical contact pads, and the thermal contact area of the die are roughened using an etch process, e.g. black oxide etch or V-bond etch, to promote adhesion of the dielectric buildup layers of the package body to exposed metal surfaces, such as the contact pads and the thermal contact area, of the die. The package body may be a laminated body comprising a layer stack of a dielectric core and dielectric buildup dielectric layers, and conductive interconnect layers. After embedding of the die, the microvias are formed by a laser drilling process, i.e. a laser ablation or etching process to remove one or more layers of the package body. A laser drilling process may include a subsequent dry etch and/or wet etch process (desmear) to remove/clean unwanted residue from the laser ablation/etching process.

Although surface roughening of metal surfaces of the contact pads and thermal pad promotes adhesion of dielectric materials of the package body, surface roughness of the metal pad area tends to increase absorption of laser energy by the metal surface. Thus, as the laser energy removes dielectric material and exposes the roughened metal surface, a significant amount of energy may be absorbed, which can cause over-heating and damage to the semiconductor device.

For example, for copper pads or contact areas, it is known that surface roughness greatly increases absorption of optical energy in processes like laser drilling. This presents a challenge for control of the process window for laser drilling. That is, too much power may cause overheating and damage, but too little power may result in poor via formation and/or liftoff. This issue with laser drilling of vias and microvias is widely recognized throughout the embedded die packaging industry. For example, current industry solutions include increasing the thickness of the metal pads or positioning the laser drilled vias away from active areas comprising critical or delicate structures on the die. Thick metal pads may not be feasible, e.g. because of stress, particularly for compound semiconductor die, and using additional die area to protect the active area from laser drilling damage increases cost per die.

There is a need for improved or alternative embedded die packaging, and methods of fabrication, which address the above-mentioned issue with laser drilling of microvias for conductive interconnect for semiconductor devices.

SUMMARY OF INVENTION

The present invention seeks to provides improved or alternative embedded die packaging for semiconductor devices, and methods of fabrication, which mitigate or circumvent the above-mentioned issue relating to damage induced by laser drilling of vias and microvias.

One aspect of the invention provides semiconductor die comprising a plurality of contact pads configured for embedded die packaging wherein conductive interconnects to said plurality of contact pads are to be provided by conductive microvias,
a surface of each of said plurality of contact pads being surface treated to provide first regions and second regions having different surface characteristics, wherein said first regions are surface treated to define target areas for laser drilling of microvias, and said second regions are surface treated to promote adhesion of package dielectric.

For example, said first regions have a first surface roughness and said second regions have a second surface roughness, the second surface roughness being greater than the first surface roughness, to promote adhesion.

A second aspect of the invention provides a method of preparing a semiconductor device for embedded packaging, comprising:
providing a die comprising a semiconductor device, the die comprising a patterned layer of conductive metallization defining electrical contact areas of the semiconductor device;
selectively providing a protective masking layer on first regions of the electrical contact areas where conductive microvias are to be formed by laser drilling;
a diameter of said first regions exceeding a diameter of microvias to be drilled by an alignment tolerance for laser drilling;
surface treating other regions of the electrical contact areas to increase surface roughness.

The protective masking layer is a material that is resistant to said step of surface treating other regions to increase surface roughness, e.g. to promote adhesion of package dielectric. For example, the protective masking layer may be one of:
a sacrificial layer which is removable during or after laser drilling to expose the conductive metallization layer within the microvias; and a non-sacrificial layer, such as an electrically conductive layer that reduces absorption of laser energy during laser drilling of microvias.

Another aspect of the invention provides a method of fabrication of an embedded die package comprising a semiconductor device, comprising:
providing a die comprising semiconductor device, the die comprising a patterned layer of conductive metallization defining electrical contact areas (pads) of the semiconductor device;
selectively providing a protective masking layer on first regions of the electrical contact areas where conductive microvias are to be formed;

embedding the die within a laminated body of the package comprising dielectric material;
laser drilling microvias through the laminated body to expose said first regions of the electrical contact areas within the microvias; and
providing electrically conductive material within the microvias.

Selectively providing the protective masking layer on regions of the electrical may comprise providing a protective masking layer on regions of the electrical contact areas where conductive microvias are to be formed and leaving other regions, i.e. second regions, of the electrical contact areas exposed; and
before embedding the die within the laminated body, performing a roughening etch of said other regions of the electrical contact areas to promote adhesion of dielectric material of the laminated body to said second regions of the electrical contact areas.

The masking layer may be a sacrificial masking layer, wherein the protective masking layer within the microvias is removed to expose the conductive metallization of the contact pads before providing electrically conductive material within the microvias.

The protective masking layer may be a sacrificial masking layer, wherein the protective masking layer within the microvias is removed to expose the conductive metallization of the contact pads within the microvias, leaving a residual region, e.g. ring or annulus of the protective masking layer on the contact pads surrounding the microvias.

The masking layer within the microvias may be removed by one of: laser drilling, a subsequent removal process, e.g. etching, and a combination thereof.

For example, the masking layer may be a polymer dielectric, such as a polyimide, which is resistant to typical roughening etches that are used to roughen the contact pads to promote adhesion, and after embedding, the polymer dielectric is removed from within the laser drilled vias.

Where the protective masking layer is a non-sacrificial layer, the protective masking layer is an electrically conductive layer, e.g. a layer of gold or other smooth metal, and the step of laser drilling of the vias exposes the protective masking layer within the microvias.

The method may be applicable to electrical contact areas of the semiconductor device comprising, e.g.: copper, aluminum, alloys of copper, alloys of aluminum and other semiconductor foundry metals used for contact areas and contact pads on semiconductor die. In some embodiments, the electrical contact areas of the semiconductor device comprise a copper redistribution layer (Cu RDL) to provide large area, low inductance contact areas, and a plurality of conductive microvias, e.g. filled with plated copper, provide electrical interconnections to conductive layers or traces of the embedded die package.

Another aspect of the invention provides an embedded die package comprising a laminated body and a die comprising a semiconductor device embedded within the laminated body, wherein:
the die comprises a patterned layer of conductive metallization on a front-side of the die providing electrical contact areas of the semiconductor device; and
a layer stack of the laminated body comprises:
a core comprising at least one dielectric layer, and at least a first dielectric buildup layer which embeds the die and a first conductive layer patterned to define interconnect areas;
a plurality of electrically conductive micro-vias interconnecting interconnect areas of the first conductive layer and electrical contact areas of the semiconductor device;

wherein the micro-vias are fabricated by methods disclosed herein.

For example, an embedded die package comprises a laminated body and a die comprising a semiconductor device embedded within the laminated body, wherein:
the die comprises a patterned layer of conductive metallization on a front-side of the die providing electrical contact areas of the semiconductor device; and
the laminated body comprises a layer stack comprising at least one dielectric layer that embeds the die and a first conductive layer patterned to define interconnect areas;
a plurality of electrically conductive micro-vias interconnecting interconnect areas of the first conductive layer and electrical contact areas of the semiconductor device;
and comprising at least one of:
an area of a protective masking layer is provided on a surface of the electrical contact areas of the semiconductor device around each micro-via;
an area of a protective masking layer is provided on a surface of the electrical contact areas of the semiconductor device within each micro-via.

For example, the laminated body laminated body may comprise a core comprising at least one dielectric layer and at least a first dielectric buildup layer which embeds the die, or the laminated body may comprise a leadframe structure and one or more dielectric layers which embed the die.

The surface of each electrical contact area of the semiconductor device may comprise first regions within the micro-vias and second regions surrounding the microvias, the second regions surrounding the micro-vias having a surface roughness greater than the first regions, e.g. to promote adhesion of dielectric material of the package body to the second regions.

In one embodiment, wherein a ring of a protective masking layer is provided on a surface of the electrical contact areas of the semiconductor device around each micro-via, said ring of protective masking layer may comprise a dielectric material, such as a polymer material, having good adhesion to both conductive metallization of the contact areas and dielectric of the package body, and which is resistant to surface treatment to roughen the second regions.

In another embodiment, wherein a ring of a protective masking layer is provided on a surface of the electrical contact areas of the semiconductor device around each micro-via, said ring of protective masking layer comprises a polyimide material having good adhesion to both conductive metallization of the contact areas and dielectric of the package body.

For example, said ring of protective masking layer has an outside diameter exceeding the bottom diameter of the micro-via by an alignment tolerance for laser drilling.

In an embodiment, wherein an area, such as a disc, of a protective masking layer is provided on a surface of the electrical contact areas of the semiconductor device within each micro-via; said disc of protective material comprises a conductive metal layer.

For example, said disc of protective material comprises a conductive metal layer which is etch resistant to surface roughening etches used for roughening other regions of the electrical contact areas to promote adhesion. Said disc of protective material may comprise a layer of gold, e.g. a flash coating of gold, or other suitable conductive material.

When a disc of a protective masking layer is provided on a surface of the electrical contact areas of the semiconductor device within each micro-via, the disc has a diameter greater than the bottom diameter of the microvias by an alignment tolerance for laser drilling.

For example, the electrical contact areas of the semiconductor device may comprise: copper, aluminum, alloys of copper, alloys of aluminum and other semiconductor foundry metals; the electrical contact areas of the semiconductor device may comprise a copper redistribution layer (Cu RDL); the dielectric material of the laminated body may comprise any one of: a glass-fiber reinforced resin composition; a glass-fiber reinforced epoxy resin composition; a dielectric resin build-up layer; a dielectric epoxy build-up layer; a build-up layer which is formed from an ABF (Ajinimoto Build-up Film); and a combination thereof.

By selectively controlling the absorption properties of contact pads where laser vias are to be drilled, the largest possible process window can be presented to the packaging supplier, without requiring changes to the packaging supplier's own process. A standard adhesion promoting roughening process is unaffected. Appropriate materials for the protective masking layer can be selected for compatibility with laser drilling using multiple laser types and for different laser wavelengths.

Thus, embodiments of the invention provide improvements to embedded die packaging and methods of fabrication of embedded die packaging comprising laser drilled vias, which mitigate one or more known issues.

BRIEF DESCRIPTION OF THE DRAWINGS

FIGS. 2A, 2B and 2C (Prior Art) shows some schematic cross-sectional views of example steps in a process flow for fabrication of an embedded die package comprising laser drilled microvias;

FIG. 3A (Prior Art) shows an enlarged schematic cross-sectional view of part of a semiconductor die comprising an electrical contact area;

FIG. 3B (Prior Art) shows an enlarged schematic cross-sectional view of part of a semiconductor die comprising an electrical contact area after embedding and laser drilling of a microvia;

FIG. 3C (Prior Art) shows a schematic top plan view of a pad area comprising a roughened surface of a metal contact area;

FIGS. 4 to 8 show schematic cross-sectional views of example steps in a process flow for surface preparation of contact areas of a die comprising a semiconductor device of a first embodiment;

FIG. 9 shows a schematic top plan view of an exposed pad area with a mask layer as illustrated schematically in cross-section FIG. 8;

FIG. 10 shows a schematic top plan view of the pad area of FIG. 8, in a surface plane of the pad metal;

FIG. 20 shows a schematic cross-sectional view of one contact pad and a microvia structure of an embedded die package the first embodiment;

FIG. 21 shows a schematic top plan view through a surface plane of the contact pad for the microvia structure illustrated schematically in FIG. 20;

FIG. 22 shows a schematic to plan view through a surface just above a surface plane of the contact pad for the microvia structure illustrated schematically in FIG. 20;

FIGS. 23 to 26 show schematic enlarged cross-sectional views of one contact pad and a microvia structure to illustrate steps in a process flow for fabrication of an embedded die package comprising a semiconductor device of a second embodiment;

FIG. 27 shows a schematic top plan view through a surface plane of the contact pad for the microvia structure illustrated schematically in FIG. 26;

The foregoing and other features, aspects and advantages of the present invention will become more apparent from the following detailed description, taken in conjunction with the accompanying drawings, of example embodiments of the invention, which description is by way of example only.

DETAILED DESCRIPTION

Figure 1:
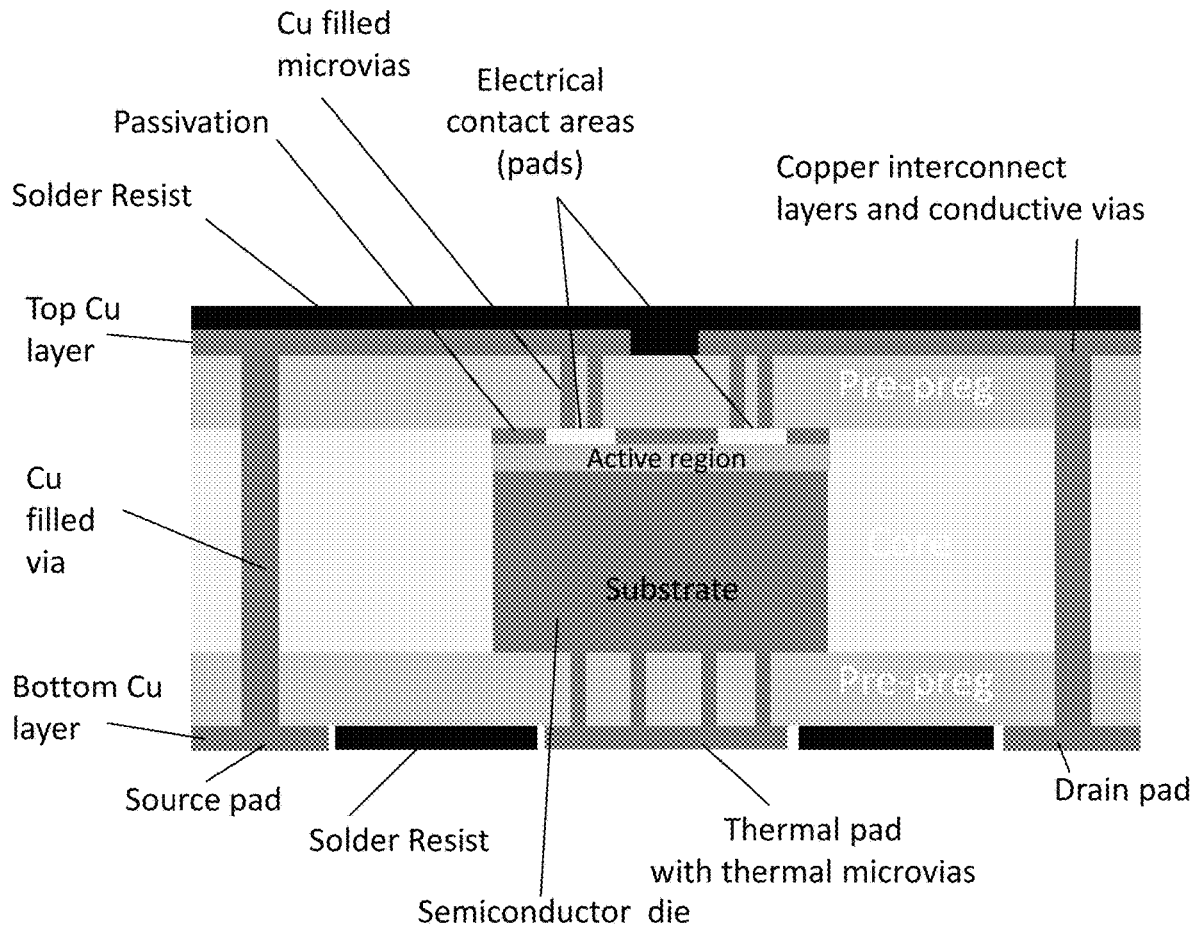
FIG. 1 (Prior Art) shows a schematic cross-sectional view of an example embedded die package comprising conductive microvias.

FIG. 1 shows a simplified schematic cross-sectional view through an example embedded die package comprising a laminated package body containing an embedded semiconductor die. For example, the semiconductor die comprises a substrate, an active device region on a front-side of the substrate, a passivation layer and electrical contact pads. The substrate may comprise a back-side metal coating to provide a thermal contact area. The body of the package comprises a layer stack (layup) of dielectric layers and conductive layers. For example, the dielectric layers comprise a core of a glass-fiber reinforced FR4 epoxy dielectric layer (light green coloured) and upper and lower fiber reinforced dielectric layers, e.g. formed from FR4 epoxy prepreg (darker green coloured). The top and bottom conductive layers are plated copper interconnect layers which are interconnected with plated copper filled conductive vias and micro-vias (copper coloured). The thermal pad and thermal vias are also formed from plated copper. For example, this type of embedded die packaging provides low inductance interconnect for packaging of power semiconductor devices such as power transistors.

In the example embedded die package shown FIG. 1, the top copper layer of the package is patterned to define source and drain interconnect area, and the bottom copper layer of the package is patterned to form source and drain and pads, and a thermal pad. (Gate connections are also provided by the copper layers and conductive vias, but are not shown in these simplified schematics). Copper filled micro-vias act as thermal vias to provide a thermal connection from the back-side of the die to the thermal pad. The top and bottom external surfaces of the package are coated with a layer of solder resist with openings for the contact pads and thermal pad. The solder resist is a thin coating of screen-printed dielectric material, which also forms a protective external coating, e.g., to protect underlying layers against oxidation and during solder reflow.

The fabrication process for this type of embedded component package is based, for example, on the AT&S ECP® or Centre Core ECP® processes, or other known industry process.

For example, referring to FIGS. 2A, 2B and 2C, the package is fabricated by placing each semiconductor die in a cavity or opening in the dielectric core, which may comprise one or more epoxy laminate layers (cured or partially cured), applying top and bottom prepreg layers (uncured), and pressing and thermally curing the epoxy laminate composition in a vacuum lamination process, so that the die is embedded in a solid dielectric body, as illustrated schematically in FIG. 2A. During lamination, the uncured epoxy is heated so it softens and flows to fill any remaining spaces, and then it is heated to a curing temperature. The prepreg layers comprise top and bottom thin copper foil layers which act as a seed layer for copper plating. The electrical connections to the die are formed in subsequent steps, e.g. by laser drilling micro-vias and through-substrate vias, as illustrated schematically in FIG. 2B. As illustrated schematically in FIG. 2C, the micro-vias and through substrate vias are then filled with plated copper, and the copper foil layers are also plated with copper to increase the copper thickness to form electrically conductive interconnect layers, and external contact pads of the package.

The core structure may comprise one thick layer of FR4 laminate that is partially or fully cured and has an opening or cavity cut out to accommodate the GaN die, or a stack of several layers of partially cured laminate, with cut out areas for the GaN die, that can be bonded together and cured in the lamination process. The laminate layers may include a woven or non-woven glass fiber cloth and an epoxy composition which includes filler particles. The build-up layers are uncured or partially cured layers of a compatible FR4 epoxy composition.

The laminate layers of the core structure and the build-up layers are not limited to FR4 type materials, and may be any suitable laminate layers, prepreg layers or alternative build-up layers, that can be stacked and pressed in a vacuum lamination process using pressure and heat, to bond the layers, embed the GaN die, and provide a structure in which the front- and back-sides are planar surfaces. In some example embodiments, the laminate layer of the core, and the build-up layers may be fiber reinforced, e.g. contain woven or non-woven glass fiber cloth impregnated with an epoxy composition or other dielectric polymer composition, which may be referred to as pre-preg or prepreg. In other embodiments, the laminate layers or build-up layers comprise particles of dielectric filler, but do not include fibers. In other example embodiments, the build-up layers may be BUF (Build-up films) of a filled epoxy composition, or another type of filled dielectric resin composition, or a particular type of BUF referred to as Ajinomoto build-up films (ABF).

The metallization layer of the contact areas (pads) on the die may be copper or copper alloys, aluminum or aluminum alloys and/or other semiconductor foundry metals typically used for pad metal. Or, as mentioned above, a Cu RDL may be used to form large area, low inductance pads.

To promote adhesion of dielectric material to the pad metal, typically the pads a treated with an etch process such as black oxide etch or V-bond etch, as illustrated schematically in FIGS. 3A and 3C. However increased surface roughness of the surface of the pad metal, e.g. copper, significantly increases absorption of laser energy, which may lead to overheating and damage to the active regions of the semiconductor device during laser drilling of microvias through the package dielectric, as illustrated schematically in FIG. 3B.

FIGS. 4 to 8 show schematic cross-sectional views to illustrate some steps in a method of fabrication of an embedded die package of a first embodiment. FIGS. 9 to 14 show schematic enlarged cross-sectional views of one contact pad and laser drilled via to show more details of the device structure and method of fabrication the first embodiment.

FIG. 4 shows a schematic cross-sectional view an example die comprising a semiconductor device having a substrate, an active layer of the semiconductor device formed on the substrate, two contact areas (pads) comprising pad metal, a top surface die passivation layer, and a backside metal layer. For example, the pad metal may be aluminum or other foundry metal used for on-chip metallization, and the die passivation may be a dielectric oxide or nitride. In other examples, the die may be processed to provide a redistribution layer, e.g. copper RDL (Cu-RDL) to provide large area contact pads for interconnect through multiple conductive microvias. FIG. 6 shows a schematic enlarged view of one pad, and surrounding die passivation layer.

FIG. 5 shows a schematic cross-sectional view of the example die with a patterned layer of protective masking material applied to the contact pads to protect the areas or regions of the pad where vias are to laser drilled, i.e. "microvia target areas". FIG. 7 shows a schematic enlarged cross-sectional view of one pad, with one microvia target area, in which is the protective masking layer is patterned to leave a disc shaped mask on a first region of the contact pad, i.e. in the microvia target area. FIG. 8 shows a schematic enlarged cross-sectional view of one pad, in which the exposed region of the pad metal, i.e. surrounding the protective masking layer, has been surface treated, e.g. roughened using a roughening etch, to promote adhesion of package dielectric during the embedding process. The layer of protective masking material is selected to be resistant to the roughening etch, or other surface treatment, used to increase the surface roughness to promote adhesion of package dielectric to the pad metal surface. For example, the protective masking layer may be a polymer dielectric, such as a polyimide, which has good adhesion to the pad metal, and is resistant to typical roughening processes, such as black oxide etch and V-etch. After masking and surface treatment, in plan view, the exposed area of the contact pad is illustrated schematically in FIG. 9.

After processing, the pad metal is selectively roughened in regions surrounding the masking layer to selectively increase surface roughness of the pad metal, while the first region where a via is to be laser drilled is protected. FIG. 10 shows a schematic plan view in a surface plane of the pad metal, i.e. in the first (target) region below the masking layer, the surface of the pad metal is unaffected by the roughening etch and remains smooth, as does any peripheral region that is underlying the die passivation, and not exposed to the roughening etch. Thus, only the exposed second region is selectively surface treated to increase surface roughness to promote adhesion of dielectric.

Figure 11A:
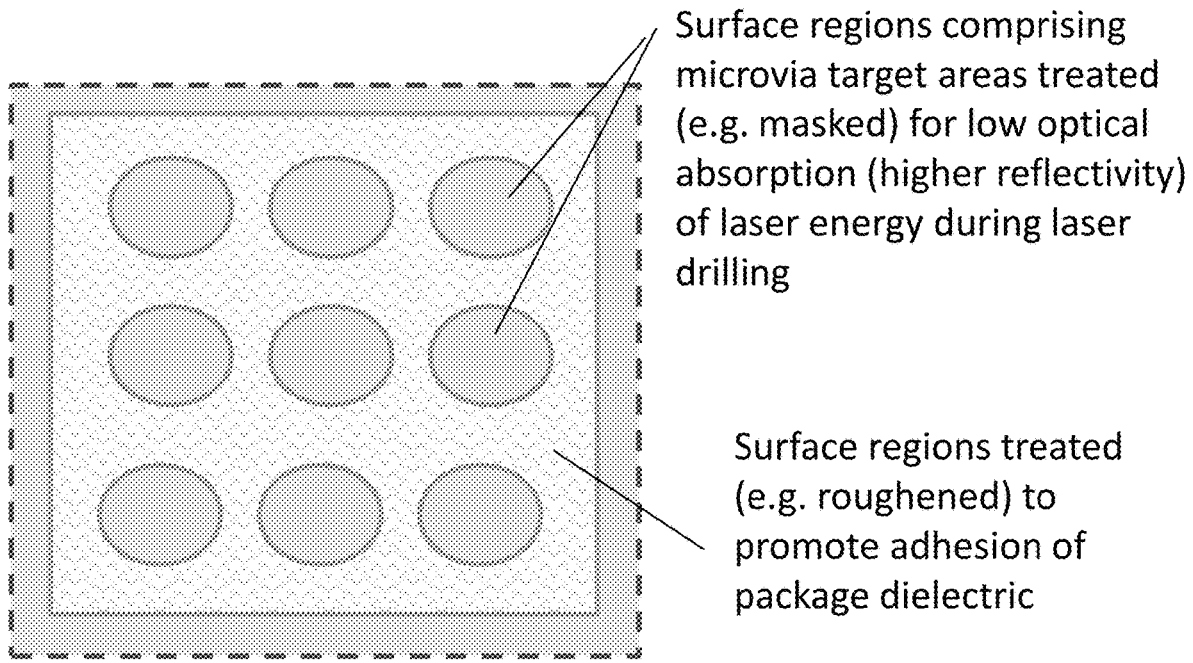
FIG. 11A show schematic top plan view of a large area contact pad which is surface treated to define target areas for laser drilling of an array of a plurality of microvias.
Figure 11B:
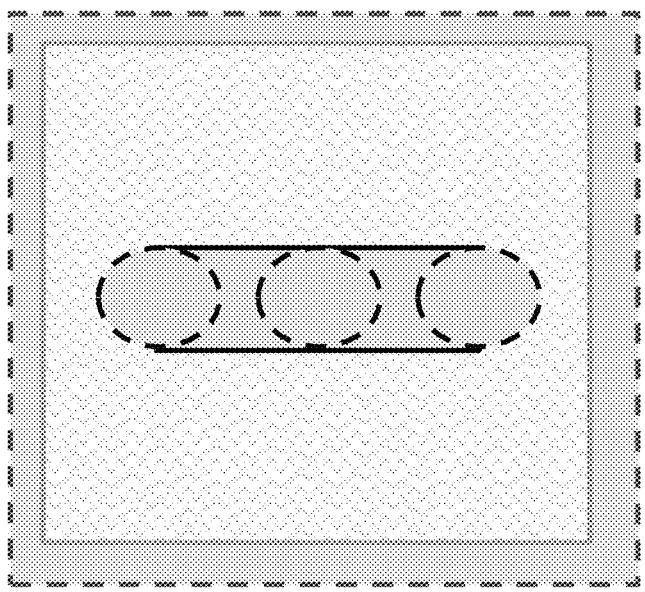
FIG. 11B show schematic top plan view of a large area contact pad which is surface treated to define target areas for laser drilling of a plurality of microvias.
Figure 12:
FIGS. 12 to 15 show schematic cross-sectional views to illustrate steps in a process flow for fabrication of an embedded die package comprising a semiconductor device of first embodiment.

FIG. 11 is a schematic plan view of a pad metal surface of a large area contact pad which has been surface treated to create a plurality of target areas for laser drilling of multiple microvias to create conductive via interconnects, as illustrated schematically in the cross-sectional view of the die shown in FIG. 5. FIG. 11B shows a schematic plan view another example embodiment where a single area of protective masking material is provided on the target area for laser drilling of a plurality of closely spaced vias.

In practice, the diameter (or dimensions if not a circular disc) of the masked area may be selected to be larger than the diameter of each microvia to be drilled by an alignment tolerance for laser drilling. For example, the microvias may have a diameter in a range of ~100 µm to ~150 µm. For ~100 µm vias, a disc of the protective masking layer having a diameter of e.g. 1.5 times the proposed diameter of the microvia, e.g. ~150 µm, may be provided to mask the target area for laser drilling while allowing a suitable alignment/misalignment tolerance for laser drilling of microvias.

After processing the die to selectively mask regions the contact areas where vias are to be drilled, and roughening of the surrounding pad metal, fabrication of embedded die packaging comprising a semiconductor device of a first embodiment proceeds as shown schematically in FIGS. 12 to 15. That is, the die shown schematically in FIG. 12 (similar to that described with reference to FIG. 8) is embedded in a dielectric core and one or more dielectric build-up layers and copper foil layers, to provide the embedded device structure shown schematically in FIG. 13. Microvias are then formed by laser drilling as shown schematically in FIG. 14. In this example there are a plurality of microvias drilled on the front-side of the die, where conductive microvias are to be formed on each contact pad, and a plurality of microvias drilled on the back-side of the die where conductive or thermal vias are to be formed. Through substrate vias may also be drilled, if required. The microvias are filled with conductive metal, e.g. plated copper, and copper plating of copper foil layers provides conductive interconnect layers of a required thickness, as illustrated schematically in FIG. 15.

Figure 16:
FIGS. 16 to 19 show schematic enlarged cross-sectional views of one contact pad and a microvia structure to illustrate steps in a process flow for fabrication of an embedded die package comprising a semiconductor device of the first embodiment.
Figure 13:
Figure 17:
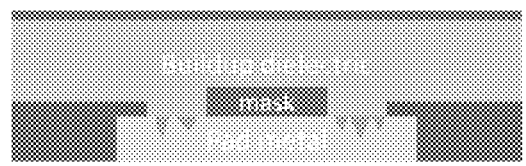
Figure 14:
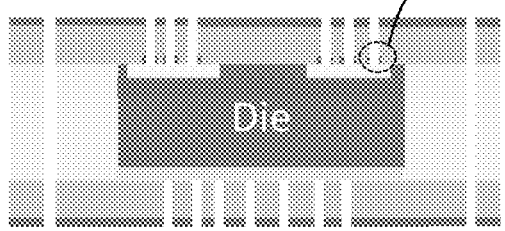
Figure 18:
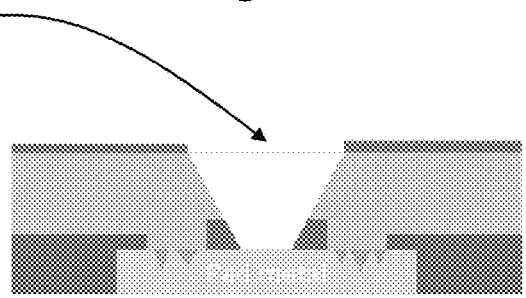
Figure 15:
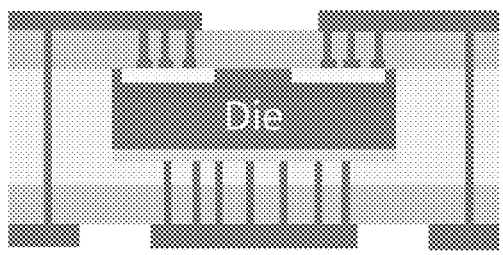
Figure 19:
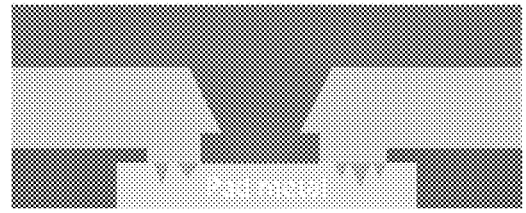

FIG. 16 shows a schematic enlarged view of one contact pad, after surface treatment as described with reference to FIG. 8, so that the pad metal is roughened to promote adhesion of the package build-up dielectric during embedding. After embedding, the device structure is illustrated schematically in FIG. 17. FIG. 18 shows a schematic enlarged view of one contact pad after laser drilling through the package material, e.g. package interconnect layer and package dielectric, such as a FR4 build-up layer, to open a microvia and after removal of the protective masking layer within the bottom of the microvia, exposing a smooth (i.e. non-roughened) surface of pad metal at the bottom of the microvia. FIG. 19 shows a schematic enlarged view of one contact pad after metal plating to fill the microvia conductive material, e.g. copper.

Laser drilling, i.e. laser etching/ablation through package material (e.g. one or more of dielectric layers), and removal of the masking layer within the via, exposes a non-roughened area of pad metal. The masking layer within the microvias may be removed during laser drilling, in a subsequent removal process, or in a combination thereof. Structurally, as illustrated schematically in FIGS. 20 to 22, this leaves a ring (annulus) of masking material around the base of each microvia. Identifiable features which would be visible in a SEM micrograph of a cross-sectional area such as shown schematically in FIG. 20, would be, e.g.: the metal fill of conductive via has interface with a smooth (non-roughened) area of pad metal; a ring of masking material is formed on a non-roughened area of pad; the surrounding area of metal pad is etched/roughened, i.e. for improved adhesion of package buildup dielectric to the roughened area of the pad metal, as illustrated schematically in the plan view shown in FIG. 21, through a surface of the pad metal in plane A of FIG. 20. FIG. 22 shows a schematic plan view through a plane B of FIG. 20 near the base of the microvia.

Optionally, the back-side of the die could also be selectively masked in the same way, before forming the thermal microvias. However, in practice overheating on back-side (substrate) of the die less of an issue than overheating on the front-side. That is, overheating during laser drilling of microvias on the front-side, overlying the active region of the semiconductor device, may cause damage in the active region comprising the semiconductor device. In this embodiment, since the protective masking material is removed from within the bottom of the microvias, i.e. it is sacrificial, a dielectric material may be use for the masking layer, e.g. a polyimide, which is compatible the package dielectric.

In an embedded die package of a second embodiment, a non-sacrificial protective masking layer is used to protect the regions where micro-vias are to be laser drilled. For example, FIG. 23 shows a schematic enlarged cross-sectional view of one contact pad comprising a layer of masking material selectively masking the microvia target area, and wherein the surrounding area of the pad has been selectively roughened. For example, a disc of the protective masking layer is provided on the pad metal. FIG. 24 shows a schematic enlarged cross-sectional view after embedding. FIG. 25 shows a schematic enlarged cross-sectional view after laser drilling to open a microvia. After laser drilling a exposing a smooth (i.e. non-roughened) surface protective masking layer is exposed at the bottom of the microvia. The disc of protective masking layer is left in place, and then via filling proceeds, e.g. as illustrated schematically in FIG. 16 to fill the microvia with plated copper. Since the disc of protective masking material is left in place with the bottom of the conductive via, as suitable electrically conductive material is used. The masking layer is selected to have a low optical absorption (high reflectivity) over a range of wavelengths to be used for laser drilling. For example, masking material may be a smooth metallic layer, such as gold, or other compatible metal, which provides a smooth surface on the regions of the contact pad where microvias are to be drilled. For example, a flash coating of gold or other material which provides a smooth surface at the bottom of the microvia, and has good adhesion to the pad metal, via metal, and package dielectric. Since a disc of masking material e.g. gold or other metal is left in place, in cross-section, would be visible on SEM photomicrograph, as illustrated schematically in FIG. 26. In plan view, the pad area will appear as illustrated schematically in FIG. 27. The diameter of the disc (or dimensions of a non-circular shape) of non-sacrificial masking material is large enough to mask a target area for laser drilling of microvias, while allowing for an alignment tolerance for laser drilling.

Figure 28:
FIGS. 28 to 30 show schematic enlarged cross-sectional views of one contact pad and a microvia structure to illustrate steps in a process flow for fabrication of an embedded die package comprising a semiconductor device of a third embodiment.
Figure 29:
Figure 30:
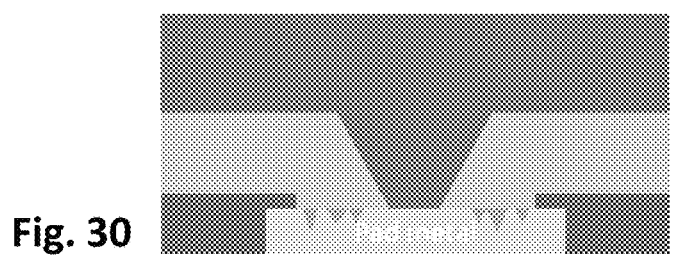
Figure 31:
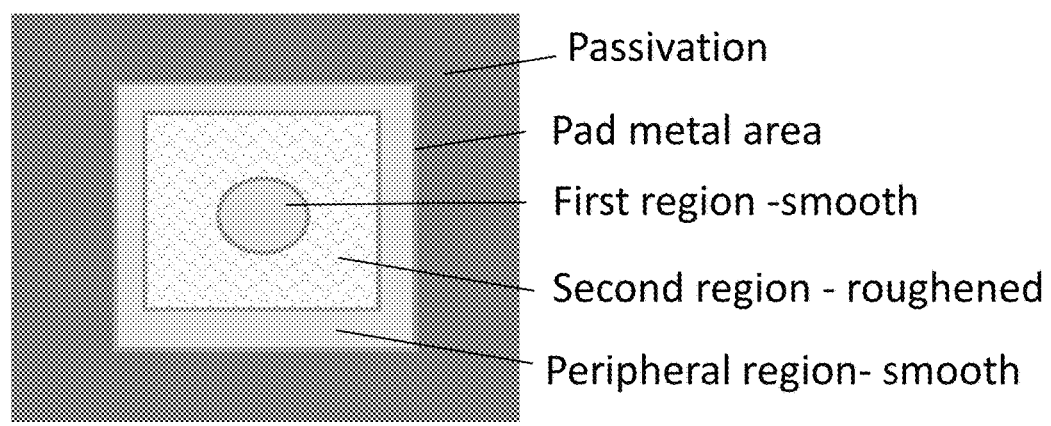
FIG. 31 shows a schematic top plan view through a surface plane of the contact pad for the microvia structure illustrated schematically in FIG. 30.
Figure 32:
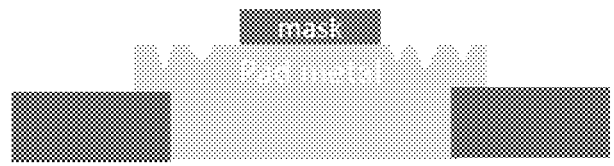
FIG. 32 shows a schematic cross-sectional view of a contact pad structure which is a variant of FIG. 28.
Figure 33:
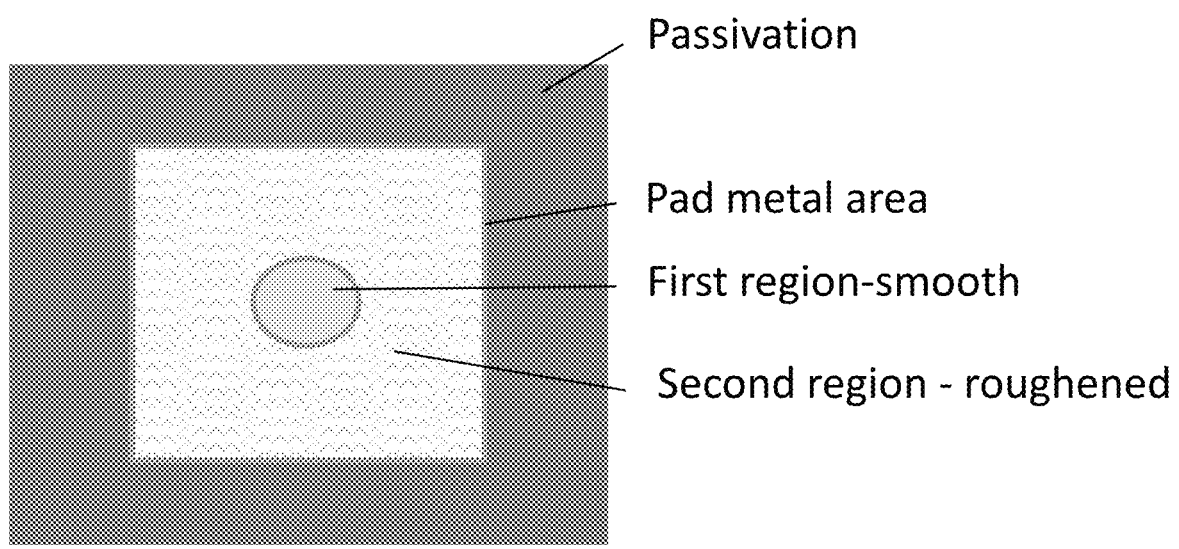
FIG. 33 shows a schematic top plan view through a surface plane of the contact pad for the structure illustrated schematically in FIG. 31.

In an embedded die package of a third embodiment, the protective masking layer is which used to protect the regions where micro-vias are to be laser drilled is removed after surface treatment to selectively increase surface roughness of other regions of the pad metal. For example, FIG. 28 shows a schematic enlarged cross-sectional view of one contact pad comprising a layer of masking material selectively masking the microvia target area, and wherein the surrounding area of the pad has been selectively roughened As illustrated schematically in FIG. 29, layer of masking material is removed before embedding, laser drilling of microvias, and copper plating to fill the microvias to provide the device structure illustrated schematically in FIG. 30. After removal of the masking layer, the surface structure of the pad metal is illustrated schematically the plan view of FIG. 31, comprising a smooth first region in the target area for laser drilling, a surrounding second region that is roughened, and a peripheral smooth region which is protected by the dielectric passivation during surface roughening. In embedded die packaging of embodiments, e.g. when the die comprises large area Cu RDL contact pads, the edges of the pad metal may extend over the surrounding passivation layer as illustrated schematically in FIG. 32. Thus, in plan view, after surface roughening, the first region comprising the target area for laser drilling is smooth, and the second region which is roughened extends to the edge of the contact pad.

For simplicity of illustration, in some example embodiments described in detail above, a single via is shown on each contact pad. In practice, an array of multiple conductive vias may be provided on each contact area, e.g. as shown in FIG. 11A or FIG. 11B.

In the embodiments described in detail, the masking layer for drilling of each micro-via has been described as a disc of masking material, and if the masking layer is sacrificial, a ring or area of residual masking material may remain around the base of each via. For example, the protective masking material may be left in place during embedding, or it may be removed entirely before embedding. In variants of these embodiments, the masked region or area may have any suitable shape, and the masked region may extend over a target area for laser drilling of more than one microvia.

In embedded die packaging of other embodiments, various materials may be used for the dielectric core and dielectric build up layers and conductive metal layers of the package body, and various types of metallization may be used to provide contact area or pads on the die (e.g. Cu-RDL, on-chip metallization using foundry metals such as aluminum). Depending on the materials of the package to be laser drilled to form the microvias, different types and wavelengths of lasers may be used for laser drilling. The choice of material for the protective masking layer may be sacrificial or non-sacrificial.

In the device structure of the embodiment shown in FIG. 8, a sacrificial masking layer is provided only on the front side contact areas (i.e. contact pads of the semiconductor device). If required, a sacrificial masking layer may be provided on the back-side of the die, which may have a back-side metal layer that provides an electrical contact area or a thermal contact area, e.g. in regions where conductive or thermal microvias are to be provided using laser drilling.

INDUSTRIAL APPLICABILITY

Embodiments of embedded die packaging comprising laser drilled vias, and methods for their fabrication disclosed herein seek to mitigate one or more issues of laser induced damage to an embedded die during laser drilling of vias.

Methods disclosed herein allow for control of the absorption properties of the pad metal of regions of the contact areas where the laser vias are to be formed using a protective masking layer. The material of the masking layer may be sacrificial or non-sacrificial.

By selectively controlling the absorption properties of pads the largest possible process window can be presented to the packaging supplier, without requiring changes to other steps of the packaging process. For example, existing adhesion promoting roughening processes, such as chemical etching can be used when regions of the pads where vias are to be laser drilled are protected by an etch resistant masking layer during the roughening process.

Specific embodiments have been described by way of example, with reference to embedded die packaging of a die comprising power semiconductor device, having large area contact pads which are interconnected to package interconnect traces by multiple conductive microvias. The device structure and method of fabrication is more generally applicable for embedded die packaging of other semiconductor devices in which one or a plurality of conductive vias are provided to provide electrical interconnections to contact pads or contact areas of the semiconductor device and wherein the conductive vias are formed by laser drilling of vias through one or more layers of the package material to expose contact pads or contact areas of the semiconductor device, which are then filled with conductive material.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A semiconductor die comprising a plurality of contact pads configured for embedded die packaging wherein conductive interconnects to said plurality of contact pads are to be provided by conductive microvias,
a surface of each of said plurality of contact pads being surface treated to provide first regions and second regions having different surface characteristics, wherein said first regions are surface treated to define target areas for laser drilling of microvias, and said second regions are surface treated to promote adhesion of package dielectric, wherein for a specified laser wavelength range for laser drilling, an optical absorption of said first regions is less than an optical absorption of said second regions.

2. The semiconductor die of claim 1, wherein said first regions have a first surface roughness and said second regions have a second surface roughness, the second surface roughness being greater than the first surface roughness.

3. An embedded die package comprising a laminated body and a die comprising a semiconductor device embedded within the laminated body, wherein:
the die comprises a patterned layer of conductive metallization on a front-side of the die providing electrical contact areas of the semiconductor device; and
the laminated body comprises a layer stack comprising at least one dielectric layer that embeds the die and a first conductive layer patterned to define interconnect areas;
a plurality of electrically conductive micro-vias interconnecting interconnect areas of the first conductive layer and electrical contact areas of the semiconductor device;
wherein a surface of the conductive metallization of said electrical contact areas of the semiconductor comprises first regions on which conductive micro-vias are formed, and second regions embedded by package dielectric, the second regions having surface characteristics different from surface characteristics of the first regions;
wherein for a specified laser wavelength range for laser drilling, an optical absorption of said first regions is less than an optical absorption of said second regions.

4. The embedded die package of claim 3, wherein a first surface roughness of said first regions is less than a second surface roughness of said second regions.

5. The embedded die package of claim 3, comprising:
an area of a protective masking layer provided on said first regions of the surface of the electrical contact areas of the semiconductor device at a base of each micro-via.

6. The embedded die package of claim 3, comprising an area of a protective masking layer provided on said first regions surrounding a base of the conductive microvias.

7. An embedded die package comprising a laminated body and a die comprising a semiconductor device embedded within the laminated body, wherein:
the die comprises a patterned layer of conductive metallization on a front-side of the die providing electrical contact areas of the semiconductor device; and
the laminated body comprises a layer stack comprising at least one dielectric layer that embeds the die and a first conductive layer patterned to define interconnect areas;
a plurality of electrically conductive micro-vias interconnecting interconnect areas of the first conductive layer and electrical contact areas of the semiconductor device;
wherein a surface of the conductive metallization of said electrical contact areas of the semiconductor comprises first regions on which conductive micro-vias are formed, and
second regions embedded by package dielectric, the second regions having surface characteristics different from surface characteristics of the first regions, comprising a disk of a protective masking layer provided on each of said first regions, the disk having a diameter that extends laterally of the base of the conductive micro-vias by an alignment tolerance for laser drilling.

8. The embedded die package of claim 7, wherein the protective masking layer comprises a material that resistant to surface treatments for roughening said second regions of the electrical contact areas.

9. The embedded die package of claim 7, wherein the protective masking layer is a polymer dielectric which is resistant to surface roughening treatments for roughening said second regions of the electrical contact areas.

10. The embedded die package of claim 9 wherein the polymer dielectric comprises a polyimide.

11. The embedded die package of claim 3, wherein an area of a protective masking layer is provided on a surface of the electrical contact areas of the semiconductor device within each micro-via.

12. The embedded die package of claim 11, wherein said area of the protective masking layer comprises a layer of gold.

13. A method of processing a semiconductor device for embedded packaging, comprising:
providing a die comprising a semiconductor device, the die comprising a patterned layer of conductive metallization defining electrical contact areas of the semiconductor device;
selectively providing a protective masking layer on a first region of each electrical contact areas on which a conductive microvia is to be formed by laser drilling of microvias;
a diameter of said first region exceeding a diameter of microvias to be drilled by an alignment tolerance for laser drilling;

surface treating second regions of the electrical contact areas to promote adhesion;

wherein for a specified laser wavelength range for laser drilling, an optical absorption of said first regions is less than an optical absorption of said second regions.

14. The method of claim 13, wherein the protective masking layer comprises a material that is resistant to said step of surface treating second regions.

15. The method of claim 13, wherein surface treating second regions to promote adhesion comprises increasing surface roughness of the second regions.

16. A method of fabrication of an embedded die package comprising a semiconductor device, comprising:
  providing a semiconductor device, the die comprising a patterned layer of conductive metallization defining electrical contact areas of the semiconductor device, wherein the electrical contact areas comprise first regions of the electrical contact areas where conductive microvias are to be formed having a first surface characteristic, and second regions of the electric contact areas having a second surface characteristic, wherein for a specified laser wavelength range for laser drilling, an optical absorption of said first regions is less than an optical absorption of said second regions;
  embedding the die within a laminated body of the package comprising dielectric material;
  laser drilling microvias through the laminated body to expose said first regions of the electrical contact areas within the microvias; and
  providing electrically conductive material within the microvias.

17. The method of claim 16, wherein selectively providing the protective masking layer on regions of the electrical contact areas comprises providing a protective masking layer on first regions of the electrical contact areas where conductive microvias are to be formed leaves second regions of the electrical contact areas exposed; and
  before embedding the die within the laminated body, performing a roughening etch of said second regions of the electrical contact areas to promote adhesion of dielectric material of the laminated body to said second regions of the electrical contact areas.

18. The method of claim 16, comprising any one of:
the protective masking layer is a sacrificial masking layer and wherein the protective masking layer within the microvias is removed to expose the conductive metallization of the contact pads before providing electrically conductive material within the microvias;
the protective masking layer is a sacrificial masking layer and wherein the protective masking layer within the microvias is removed to expose the conductive metallization of the contact pads within the microvias, leaving a residual ring of the masking layer on the contact pads surrounding the microvias;
wherein the protective masking layer within the microvias is removed by one of: laser drilling, a subsequent removal process, and a combination thereof;
the protective masking layer comprises a layer of a polymer material having good adhesion to the conductive metallization of the contact areas and dielectric material of the laminated body; and
the protective masking layer is an electrically conductive layer and the step of laser drilling exposes the protective masking layer within the microvias.

* * * * *